United States Patent
Hsieh

(10) Patent No.: US 11,776,979 B2
(45) Date of Patent: Oct. 3, 2023

(54) PHOTOSENSITIVE DEVICE COMPRISING PATTERNED SEMICONDUCTOR POLARIZER

(71) Applicant: UNITED MICROELECTRONICS CORP., Hsinchu (TW)

(72) Inventor: Cheng-Yu Hsieh, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 310 days.

(21) Appl. No.: 16/802,965

(22) Filed: Feb. 27, 2020

(65) Prior Publication Data

US 2021/0210537 A1 Jul. 8, 2021

(30) Foreign Application Priority Data

Jan. 8, 2020 (CN) .......................... 202010017269.6

(51) Int. Cl.
| | |
|---|---|
| *H01L 27/146* | (2006.01) |
| *H01L 31/0232* | (2014.01) |
| *H01L 31/0216* | (2014.01) |
| *G02B 5/30* | (2006.01) |
| *G02B 3/00* | (2006.01) |

(52) U.S. Cl.
CPC .... *H01L 27/14625* (2013.01); *H01L 27/1463* (2013.01); *H01L 27/1464* (2013.01); *H01L 27/14643* (2013.01); *H01L 31/02327* (2013.01); *G02B 3/0006* (2013.01); *G02B 5/3025* (2013.01); *H01L 27/14603* (2013.01); *H01L 27/14627* (2013.01); *H01L 27/14629* (2013.01); *H01L 31/02162* (2013.01)

(58) Field of Classification Search
CPC ......... H01L 27/14603; H01L 27/14625; H01L 27/14627; H01L 27/14629; H01L 27/1463; H01L 27/1464; H01L 27/14643; H01L 31/02162; H01L 31/02327; G02B 3/0006; G02B 5/3025
See application file for complete search history.

(56) References Cited

U.S. PATENT DOCUMENTS

| | | | |
|---|---|---|---|
| 8,680,591 B2 | 3/2014 | Haddad et al. | |
| 2018/0301494 A1* | 10/2018 | Park | H01L 27/3234 |
| 2019/0006407 A1 | 1/2019 | Uesaka | |
| 2019/0067355 A1* | 2/2019 | Li | H01L 27/14629 |
| 2020/0027915 A1* | 1/2020 | Hsieh | H01L 31/02366 |
| 2020/0075656 A1* | 3/2020 | Lee | H01L 27/14643 |
| 2020/0103511 A1* | 4/2020 | Jin | G01S 17/894 |
| 2020/0411570 A1* | 12/2020 | Noudo | H04N 5/359 |

FOREIGN PATENT DOCUMENTS

| | | |
|---|---|---|
| JP | 4974543 B2 | 7/2012 |
| WO | WO2019092988 A1 | 5/2019 |

OTHER PUBLICATIONS

Office Action issued by CNIPA dated Jun. 15, 2023.

\* cited by examiner

*Primary Examiner* — Herve-Louis Y Assouman
*Assistant Examiner* — Christopher M Roland
(74) *Attorney, Agent, or Firm* — WPAT, P.C

(57) ABSTRACT

A photosensitive device includes a semiconductor substrate and a photodiode. The semiconductor substrate has a patterned semiconductor polarizer having a semiconductor surface. The photodiode is in the semiconductor substrate.

17 Claims, 4 Drawing Sheets

PHOTOSENSITIVE DEVICE COMPRISING PATTERNED SEMICONDUCTOR POLARIZER

This application claims the benefit of People's Republic of China application Serial No. 202010017269.6, filed Jan. 8, 2020, the subject matter of which is incorporated herein by reference.

BACKGROUND

Technical Field

The disclosure relates to a photosensitive device, and particularly relates to a photosensitive device having a semiconductor polarizer.

Description of the Related Art

As computer and communications Industries are developed, demands for photosensitive devices such as image sensors with high efficiency are increased, which can be applied in various technical fields such as a digital Camera, a video camera, a personal communication system, a game component, a monitor, a micro-camera for medical use, a robot, and so on.

A backside illuminated image sensor is one familiar kind of image sensor devices and has high efficiency. In addition, the backside illuminated image sensor may be fabricated with a process which may be integrated in a conventional semiconductor manufacturing process. Therefore, the backside illuminated image sensor has advantages of low manufacturing cost, small feature size, and high integration. Moreover, the backside illuminated image sensor also has advantages of low operating voltage, low power consumption, high quantum efficiency, low read-out noise, being able to perform random access with need. Thus the backside illuminated image sensor has been widely used in current electronic products.

With trends of component size scaling down and semiconductor manufacturing development, a size of the backside illuminated image sensor becomes smaller. In addition, the backside illuminated image sensor need to meet the requirement of high photo-electric conversion efficiency, high sensitivity, low noise, etc.

SUMMARY

The present disclosure relates to a photosensitive device.

According to a concept of the present disclosure, a photosensitive device is provided. The photosensitive device comprises a semiconductor substrate and a photodiode. The semiconductor substrate has a patterned semiconductor polarizer having a semiconductor surface. The photodiode is in the semiconductor substrate.

According to another concept of the present disclosure, a photosensitive device is provided. The photosensitive device comprises a photodiode, a reflective grid element and a patterned semiconductor polarizer. The photodiode and the reflective grid element are respectively on opposing sides of the patterned semiconductor polarizer.

Figure 1:
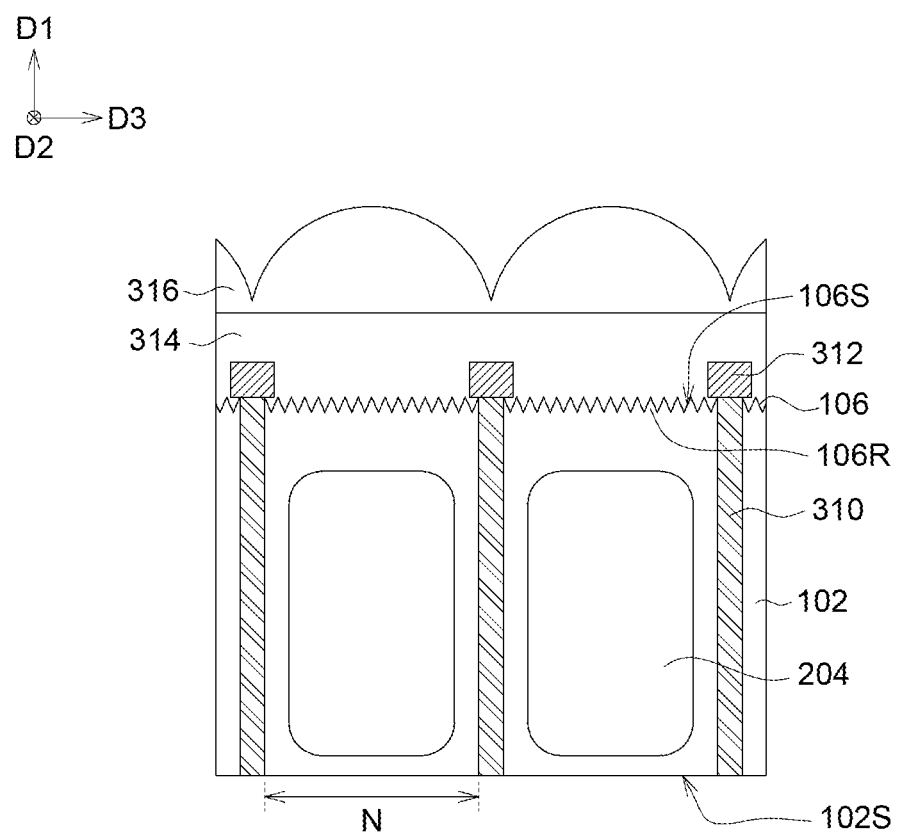
FIG. 1 illustrates a cross-section view of a photosensitive device according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Embodiments are provided hereinafter with reference to the accompanying drawings for describing the related procedures and configurations. It is noted that not all embodiments of the invention are shown. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense. The identical and/or similar elements of the embodiments are designated with the same and/or similar reference numerals.

FIG. 1 is referred to, which illustrates a cross-section view of a photosensitive device according to an embodiment. The photosensitive device comprises a semiconductor substrate 102. The semiconductor substrate 102 may comprise any suitable semiconductor material. In an embodiment, the semiconductor substrate 102 is a silicon substrate, which may consist of silicon. In other embodiments, for example, the semiconductor substrate 102 is a silicon-containing substrate, a III-V group-on-silicon substrate such as a GaN-on-silicon substrate, a graphene-on-silicon substrate, or a silicon-on-insulator (SOI) substrate, and so on, and is not limited thereto. The semiconductor substrate 102 may have a photosensitive element formed therein. In embodiments, the photosensitive element comprises at least a sensing region, such as a photodiode 204. The photosensitive element may also comprise a charge-coupled device (CCD), a complementary metal-oxide-semiconductor image sensor (CMOS image sensor, CIS), an active-pixel sensor (API), or a passive-pixel sensor (PPI), and so on.

In embodiments, the semiconductor substrate 102 of the photosensitive device has a patterned semiconductor polarizer 106. The patterned semiconductor polarizer 106 has a semiconductor surface 106S. In an embodiment, the semiconductor surface 106S may be a rear semiconductor surface of the semiconductor substrate 102, and opposing to a front semiconductor surface 102S of the semiconductor substrate 102.

In embodiments, the patterned semiconductor polarizer 106 of the semiconductor substrate 102 on a light incident side of the semiconductor substrate 102 can filter an incident light to allow only a light having an expected polarization direction to pass into the semiconductor substrate 102 so as to be sensed by the photosensitive element such as the photodiode 204. A light having an un-expected polarization direction is unable to pass through the semiconductor polarizer. Otherwise, the light having the un-expected polarization direction may be reflected from the semiconductor surface 106S back to an external condition. Therefore, sensing efficiency and accuracy of the photosensitive device can be increased.

Figure 2:
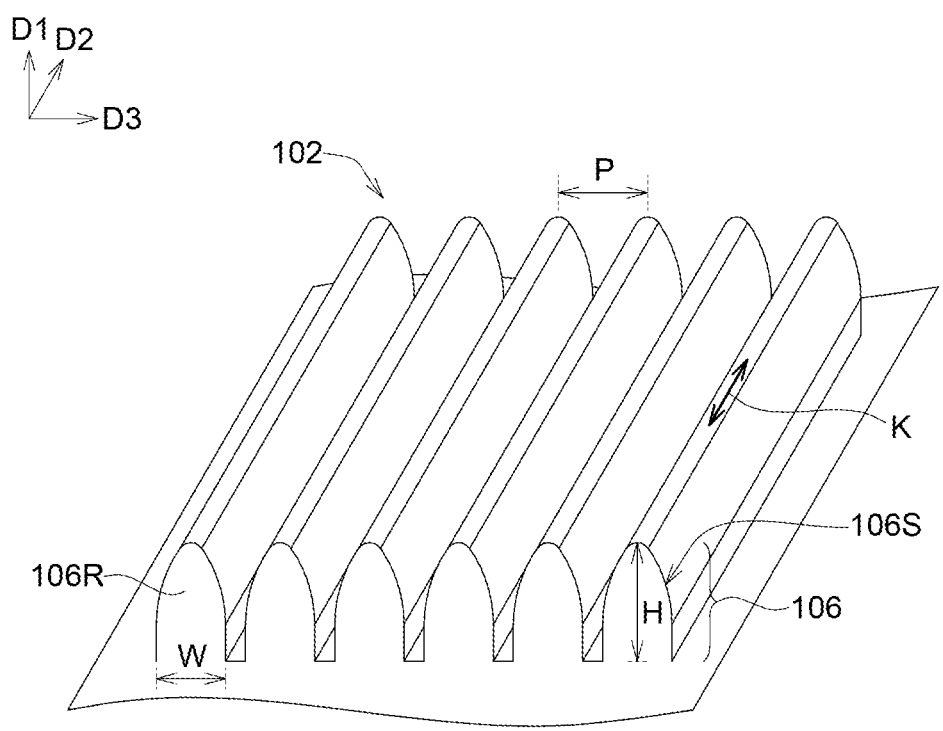
FIG. 2 illustrates a stereoscopic diagram of a portion of a semiconductor substrate in a polarizing region according to an embodiment.

FIG. 1 and FIG. 2 are referred to. FIG. 2 illustrates a stereoscopic diagram of a portion of the semiconductor substrate 102 in one polarizing region. The patterned semiconductor polarizer 106 has bar shape portions 106R bulged in a direction D1 (such as a Z direction, a height direction, a vertical direction, or a longitudinal direction). The bar shape portion 106R may be extended continuously along an extending direction K. In this embodiment, the extending direction K of the bar shape portion 106R may be substantially parallel to a direction D2 (such as a Y direction that may be substantially perpendicular to the Z direction). In this embodiment, the bar shape portion 106R in a longitudinal section may have a shape of an upper portion narrower than a lower portion, for example, a ridge shape having a width becoming wider gradually from a peak to a bottom. A bottom portion of the bar shape portion 106R in a direction D3 (such as an X direction that may be substantially perpendicular to the Z direction and the Y direction) may have a size W (such as a width) of 50 nm-500 nm. The bar shape portion 106R in the direction D1 may have a size H (such as a height) of 50 nm-500 nm. The bar shape portions 106R in the direction D3 may have a pitch P (or space) of 50 nm-300 nm. In embodiments, the bar shape portions 106R in one polarizing region may have the same extending direction K. The bar shape portions 106R in one polarizing region may have the same size W, the same size H, and/or the same pitch P. However, the present disclosure is not limited thereto. The bar shape portions 106R in the polarizing region may have the various sizes W, sizes H and/or pitches P. The bar shape portions 106R of the patterned semiconductor polarizer 106 may be formed by a lithographic etching process performed on the rear semiconductor surface of the semiconductor substrate 102. The lithographic etching process may comprise a step applying a photo-resist and/or a hard mask, for example.

Referring to FIG. 1, a trench isolation element 310 may be formed in the semiconductor substrate 102, and used to isolate the photosensitive elements from each other. The trench isolation element 310 may be extended from the semiconductor surface 106S to the front semiconductor surface 102S. The trench isolation element 310 may comprise a deep trench isolation element having opposing surfaces respectively exposed from the semiconductor surface 106S and the front semiconductor surface 102S. The trench isolation element 310 may comprise a material having a refractive index different from a refractive index of a material of the semiconductor substrate 102. For example, the material of the trench isolation element 310 may be an insulating material, for example, comprising an oxide such as silicon oxide, but not limited thereto. The trench isolation element 310 may be used to reflect the incident light into the photosensitive element such as the photodiode 204, and by which photo sensing efficiency can be increased, light interference from an adjacent pixel can be avoided, and sensing accuracy can be increased.

A reflective grid element 312 may be disposed on the light incident side of the patterned semiconductor polarizer 106. The photodiode 204 and the reflective grid element 312 are respectively on opposing sides of the patterned semiconductor polarizer 106. In an embodiment, the reflective grid element 312 may be disposed on the trench isolation element 310. An array of openings may be defined by the reflective grid element 312. In an embodiment, the trench isolation element 310 may be corresponded to the reflective grid element 312. In other words, the trench isolation element 310 and the reflective grid element 312 may be overlapped with each other in the direction D1. The reflective grid element 312 may comprise a reflective material, such as a metal, or other suitable materials. In an embodiment, the reflective grid element 312 having conductive property (for example a metal) may be floating or grounded. The reflective grid element 312 may be used to reflect a light onto the semiconductor surface 106S of the patterned semiconductor polarizer 106, and by which photo sensing efficiency can be increased, light interference from an adjacent pixel can be avoided, and sensing accuracy can be increased.

An optical layer 314 may be disposed on the semiconductor surface 106S of the patterned semiconductor polarizer 106. The optical layer 314 may comprise a transparent layer comprising an oxide such as silicon oxide, silicon oxynitride, etc., but is not limited thereto. The optical layer 314 may also comprise an anti-reflective layer or other element layers having proper optical effect. In an embodiment, a bottom surface of the optical layer 314 may be complementary to the semiconductor surface 106S of the patterned semiconductor polarizer 106.

A lens 316 may be disposed on the light incident side of the patterned semiconductor polarizer 106. In an embodiment, the lens 316 may be disposed on an upper surface of the optical layer 314. The lens 316 may comprise a micro lens array. The lens 316 may refract an incident light so as to focus the light toward the photosensitive element such as the photodiode 204 in the semiconductor substrate 102, and by which photo sensing efficiency and sensing accuracy can be increased.

In an embodiment, the photosensitive device is a backside illuminated image sensor. In an embodiment, the photosensitive device is an infrared sensor, for example, for sensing a far infrared light. In an embodiment, a pixel of the photosensitive device may be defined by a region unit of the semiconductor substrate 102 surrounded by the trench isolation element 310. In an embodiment, the pixels are defined by regions surrounded by the reflective grid element 312. Alternatively, the openings of the reflective grid element 312 may correspond to the pixels, and/or may correspond to the region units of the semiconductor substrate 102 surrounded by the trench isolation element 310. In an embodiment, the pixels of the photosensitive device may respectively correspond to units of the lenses 316, and/or the photosensitive elements such as the photodiodes 204, and so on.

In embodiments, the pixel is not limited to the profile of the bar shape portions 106R, and is not limited to the polarizing region in which the extending direction K of the bar shape portion 106R is parallel to the direction D2, as shown in FIG. 1 and FIG. 2.

Figure 3:
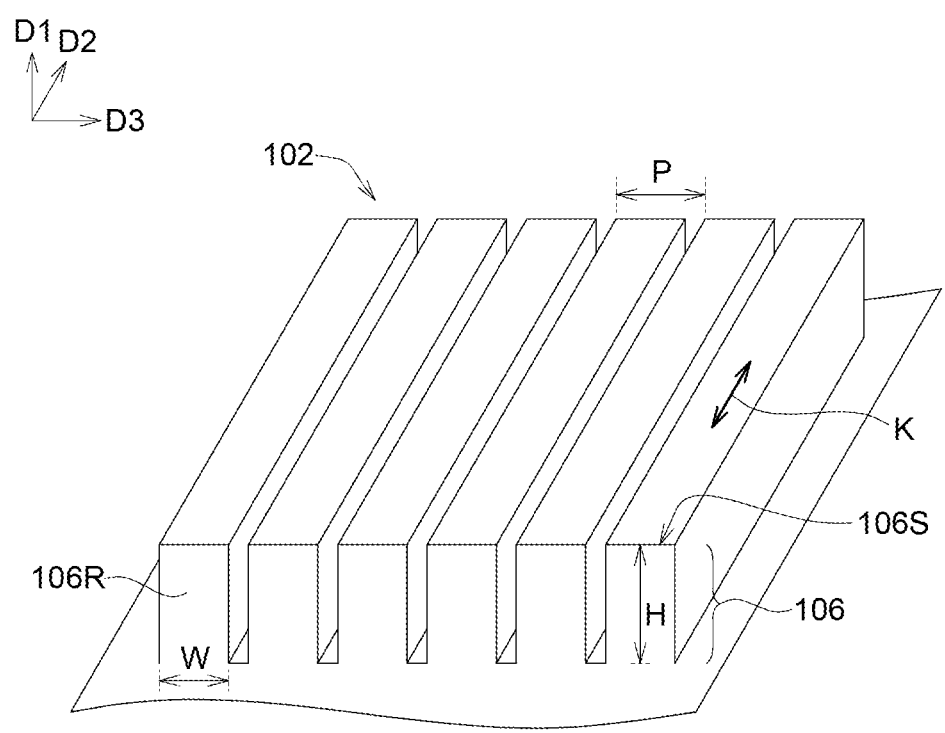
FIG. 3 illustrates a stereoscopic diagram of a portion of a semiconductor substrate in a polarizing region according to another embodiment.

FIG. 3 illustrates a stereoscopic diagram of a portion of the semiconductor substrate 102 in one polarizing region according to another embodiment, which is different from the semiconductor substrate 102 shown in FIG. 2 with the following description. In this embodiment, the bar shape portion 106R in the longitudinal section may have a rectangle shape having a uniform width, and the opposite angles of the top portion of the bar shape portion 106R of the direction D3 may be right angles substantially. The bar shape portion 106R may have the size W of 50 nm-500 nm. The description that may be similar to the description with referring to FIG. 2 is not repeated herein.

In other embodiments, the amount of the polarizing region for the pixel may be one, two, three, four, or more. In addition, the extending direction K of the bar shape portion 106R of the polarizing region may be arbitrarily adjusted according to actual demand for the polarizing effect of the photosensitive device.

Figure 4:
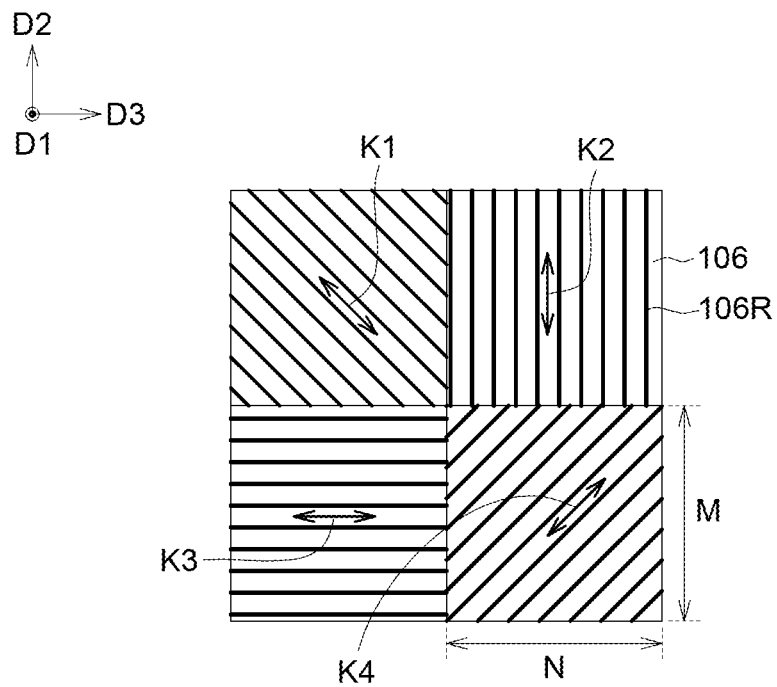
FIG. 4 illustrates an arrangement of bar shape portions of a patterned semiconductor polarizer in four pixels in an embodiment.

FIG. 4 is referred to, which illustrates an arrangement of bar shape portions 106R of the patterned semiconductor polarizer 106 in four pixels in an embodiment. In FIG. 4, the thicker line is used to indicate the arrangement of the top portions of the bar shape portions 106R, and the thinner line is used to indicate the region of the pixels. In this embodiment, each of the four pixels has one polarizing region. The extending direction K1, the extending direction K2, the extending direction K3, and the extending direction K4 of bar shape portions 106R in the four polarizing regions as shown in FIG. 4 are different from each other, which may result in the polarizing directions of the four polarizing regions different from each other. For example, the difference between arbitrary two extending directions of the extending direction K1, the extending direction K2, the extending direction K3, and the extending direction K4 may be 45 degrees or 90 degrees. The pixel in the direction D2 may have a size M of 0.7 μm-15 μm. The pixel in the direction D3 may have a size N of 0.7 μm-15 μm. However, the present disclosure is not limited thereto.

Figure 5:
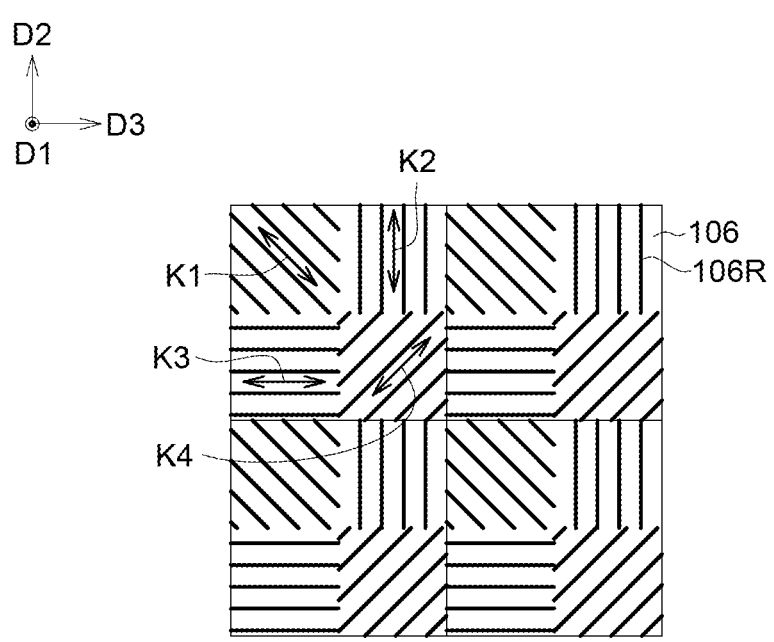
FIG. 5 illustrates an arrangement of bar shape portions of a patterned semiconductor polarizer in four pixels in another embodiment.

FIG. 5 is referred to, which illustrates an arrangement of bar shape portions 106R of the patterned semiconductor polarizer 106 in four pixels in an embodiment. The arrangement in FIG. 5 is different from the arrangement in FIG. 4 with the following description. In this embodiment, each of the four pixels has four polarizing regions having the bar shape portions 106R of the extending directions different from each other. For example, in one pixel, the difference between arbitrary two extending directions of the extending direction K1, the extending direction K2, the extending direction K3, and the extending direction K4 of the bar shape portions 106R in the four polarizing regions may be 45 degrees or 90 degrees. The pixel in the direction D2 may have the size M of 1.1 μm-15 μm. The pixel in the direction D3 may have the size N of 1.1 μm-15 μm. However, the present disclosure is not limited thereto.

Accordingly, the photosensitive device according to concepts in embodiments may have at least one of the following advantages. The semiconductor substrate has the patterned semiconductor polarizer in the light incident side, and the patterned semiconductor polarizer can filter the incident light, and therefore sensing efficiency and accuracy of the photosensitive device is increased. The trench isolation element formed in the semiconductor substrate can be used to reflect the incident light into the photosensitive element such as the photodiode, by which photo sensing efficiency can be increased, light interference from an adjacent pixel can be avoided, and sensing accuracy can be increased. The reflective grid element disposed on the light incident side of the patterned semiconductor polarizer can be used to reflect the light to the semiconductor surface of the patterned semiconductor polarizer, and by which photo sensing efficiency can be increased, light interference from an adjacent pixel can be avoided, and sensing accuracy can be increased. The lens disposed on the light incident side of the patterned semiconductor polarizer can refract the incident light so as to focus the light toward the photosensitive element such as the photodiode in the semiconductor substrate, and by which photo sensing efficiency and sensing accuracy can be increased. Therefore, the photosensitive device according to the concepts in embodiments can have excellent sensing efficiency and sensing accuracy.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A photosensitive device, comprising:
   a semiconductor substrate having a patterned semiconductor polarizer having a semiconductor surface, wherein the semiconductor substrate has a rear semiconductor surface and a front semiconductor surface opposing to the rear semiconductor surface, the semiconductor surface of the patterned semiconductor polarizer is the rear semiconductor surface;
   a photodiode in the semiconductor substrate;
   a trench isolation element in the semiconductor substrate, wherein the trench isolation element is extended from the semiconductor surface to the front semiconductor surface and comprises opposing surfaces respectively exposed from the semiconductor surface and the front semiconductor surface; and
   a reflective grid element on a light incident side of the patterned semiconductor polarizer, wherein the reflective grid element reflects a light onto the semiconductor surface of the patterned semiconductor polarizer before the light is polarized by the patterned semiconductor polarizer, and the reflective grid element is directly on the trench isolation element.

2. The photosensitive device according to claim 1, wherein the patterned semiconductor polarizer has bar shape portions extended continuously along an extending direction.

3. The photosensitive device according to claim 1, wherein the patterned semiconductor polarizer has bar shape portions extended continuously along different extending directions.

4. The photosensitive device according to claim 1, wherein the patterned semiconductor polarizer has polarizing regions having different polarizing directions.

5. The photosensitive device according to claim 4, comprising pixels having the polarizing regions having the different polarizing directions.

6. The photosensitive device according to claim 4, comprising pixels each having one of the polarizing regions having the different polarizing directions.

7. The photosensitive device according to claim 4, comprising pixels each having two or more of the polarizing regions having the different polarizing directions.

8. The photosensitive device according to claim 4, comprising pixels each having four of the polarizing regions having the different polarizing directions.

9. The photosensitive device according to claim 1, further comprising an optical layer on the semiconductor surface of the patterned semiconductor polarizer.

10. The photosensitive device according to claim 9, wherein the optical layer has a bottom surface complementary to the semiconductor surface of the patterned semiconductor polarizer.

11. The photosensitive device according to claim 1, further comprising a lens on the light incident side of the patterned semiconductor polarizer.

12. A photosensitive device, comprising:
- a photodiode;
- a reflective grid element;
- a patterned semiconductor polarizer, wherein the photodiode and the reflective grid element are respectively on opposing sides of the patterned semiconductor polarizer such that a light is reflected by the reflective grid element before passing through the patterned semiconductor polarizer and arriving at the photodiode; and
- a trench isolation element, wherein the trench isolation element and the reflective grid element are respectively on opposing sides of the patterned semiconductor polarizer, the trench isolation element comprises a first surface and a second surface opposite to the first surface, the first surface is higher than the photodiode in a longitudinal direction, the second surface is lower than the photodiode in the longitudinal direction, and the reflective grid element is directly on the trench isolation element.

13. The photosensitive device according to claim 12, wherein the reflective grid element is on a light incident side of the patterned semiconductor polarizer.

14. The photosensitive device according to claim 12, wherein the reflective grid element comprises a metal.

15. The photosensitive device according to claim 12, comprising a semiconductor substrate comprising the patterned semiconductor polarizer.

16. The photosensitive device according to claim 15, wherein the patterned semiconductor polarizer has a rear semiconductor surface of the semiconductor substrate.

17. The photosensitive device according to claim 12, wherein the patterned semiconductor polarizer has bar shape portions extended continuously along different extending directions in different polarizing regions respectively.

\* \* \* \* \*